United States Patent [19]

Hayes

[11] Patent Number: 5,193,738
[45] Date of Patent: Mar. 16, 1993

[54] METHODS AND APPARATUS FOR SOLDERING WITHOUT USING FLUX

[75] Inventor: Donald J. Hayes, Plano, Tex.

[73] Assignee: MicroFab Technologies, Inc., Plano, Tex.

[21] Appl. No.: 946,665

[22] Filed: Sep. 18, 1992

[51] Int. Cl.⁵ .................... B23K 3/08; B23K 26/00
[52] U.S. Cl. .................... 228/180.2; 228/205; 228/254; 228/6.2; 228/33; 219/121.85
[58] Field of Search ............. 228/205, 242, 254, 240, 228/180.2, 6.2, 33; 219/121.6, 121.85

[56] References Cited

U.S. PATENT DOCUMENTS

| | | | |
|---|---|---|---|
| 4,337,886 | 7/1982 | King et al. | 228/263.13 |
| 4,423,120 | 12/1983 | Paulus et al. | 228/203 |
| 5,090,609 | 2/1992 | Nakao et al. | 228/180.2 |

*Primary Examiner*—Samuel M. Heinrich
*Attorney, Agent, or Firm*—Jack A. Kanz

[57] ABSTRACT

Metallic surfaces are soldered together without using flux or solvents. The metallic surfaces are maintained in an atmosphere of inert gas and cleaned with a laser. An ejection device deposits drops of liquid solder on a predetermined one of the metallic surfaces and the metallic surfaces are moved relative to each other so that the solidified solder contacts the other metallic surface. The metallic surfaces and the solidified solder are then heated until the solidified solder reflows and joins the metallic surfaces.

20 Claims, 3 Drawing Sheets

(PRIOR ART)

METHODS AND APPARATUS FOR SOLDERING WITHOUT USING FLUX

This invention relates in general to application of solder to areas to be wetted. More particularly, but not by way of limitation, it relates to methods and apparatus for soldering metallic surfaces together without using flux or solvents.

In high density electronic manufacturing processes, microelectronic devices are bonded to a substrate by a solder reflow process. In the prior art, as illustrated in FIGS. 1 and 2, a microelectronic device 10 such as a surface mountable package, integrated circuit chip or the like, is operatively joined to a substrate 12 by a solder reflow process. The interconnect material between the microelectronic device 10 and the substrate 12 is in the form of a solder bump or ball 14 prior to the solder reflow process. The solder bumps or balls 14 are placed on the wettable metal pads 16 of the microelectronic device 10 by any of various processes. Prior to placing the solder bumps or balls 14 on the wettable metal pads 16, pads 16 must be cleaned of dirt, film, oxides, etc., which would prevent proper fusion of the wettable metal pads 16 and the previously cleaned wettable connect or bond pads 18 on the substrate 12 and result in a poor electrical connection. In many cases a solvent is used to clean the wettable metal pads 16 and the wettable connect or bond pads 18. In nearly all cases flux in one form or another is placed on pads 16 and 18 to also clean and free the surfaces of the pads from oxides and to promote the union or bonding of pads 16 and 18. After the soldering process, a flux residue remains which is usually removed with a solvent or solvents.

The bonding process utilizes solder bumps or balls deposited on the wettable metal pads 16 on microelectronic device 10. Microelectronic device 10 (the upside-down surface mount package sometimes referred to as a flip chip) is then rotated over (see FIG. 2) so that the solder bumps or balls 14 are aligned with the correct matching footprint of solder wettable connect or bond pads 18 on substrate 12. When heat is applied all joints or interconnects between the wettable metal pads 16 on the microelectronic device 10 and the solder wettable connect or bond pads 18 on substrate 12 are made simultaneously by reflowing the solder in the solder bumps or balls 14. A primary disadvantage to this process, however, is the necessity to use various solvents and fluxes which are not environmentally desirable.

In accordance with the present invention metallic surfaces are joined without using flux or solvents. Instead, the metallic surfaces to be joined are maintained in an atmosphere of substantially inert gas while a laser device cleans the metallic surfaces drops of liquid solder are deposited on one of the metallic surfaces. The metallic surfaces are then positioned so that the solidified solder deposited on the one surface contacts the other metallic surface and the metallic surfaces are heated until the solidified solder reflows and joins the metallic surfaces. The present invention thus eliminates the need for and use of flux or solvents in the solder process. Other advantages and features of the invention will become more apparent from the following detailed description taken in connection with the accompanying drawing, wherein like reference numerals have been applied to like elements, and in which:

Figure 1:
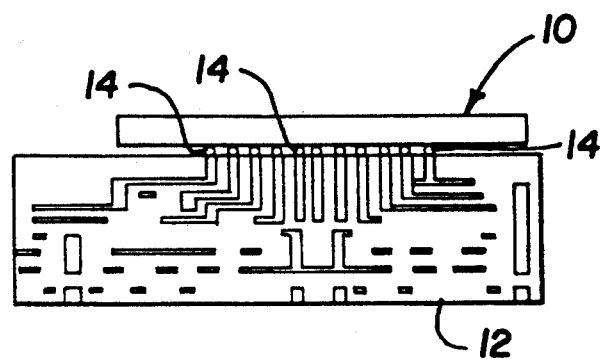
FIG. 1 is a simplified pictorial illustration of a microelectronic device bonded to a substrate.
Figure 2:
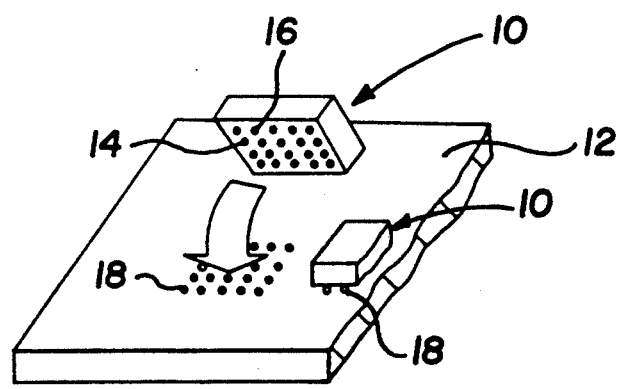
FIG. 2 is a simplified pictorial illustration of one step in the prior art process of bonding a microelectronic device to a substrate.
Figure 3:
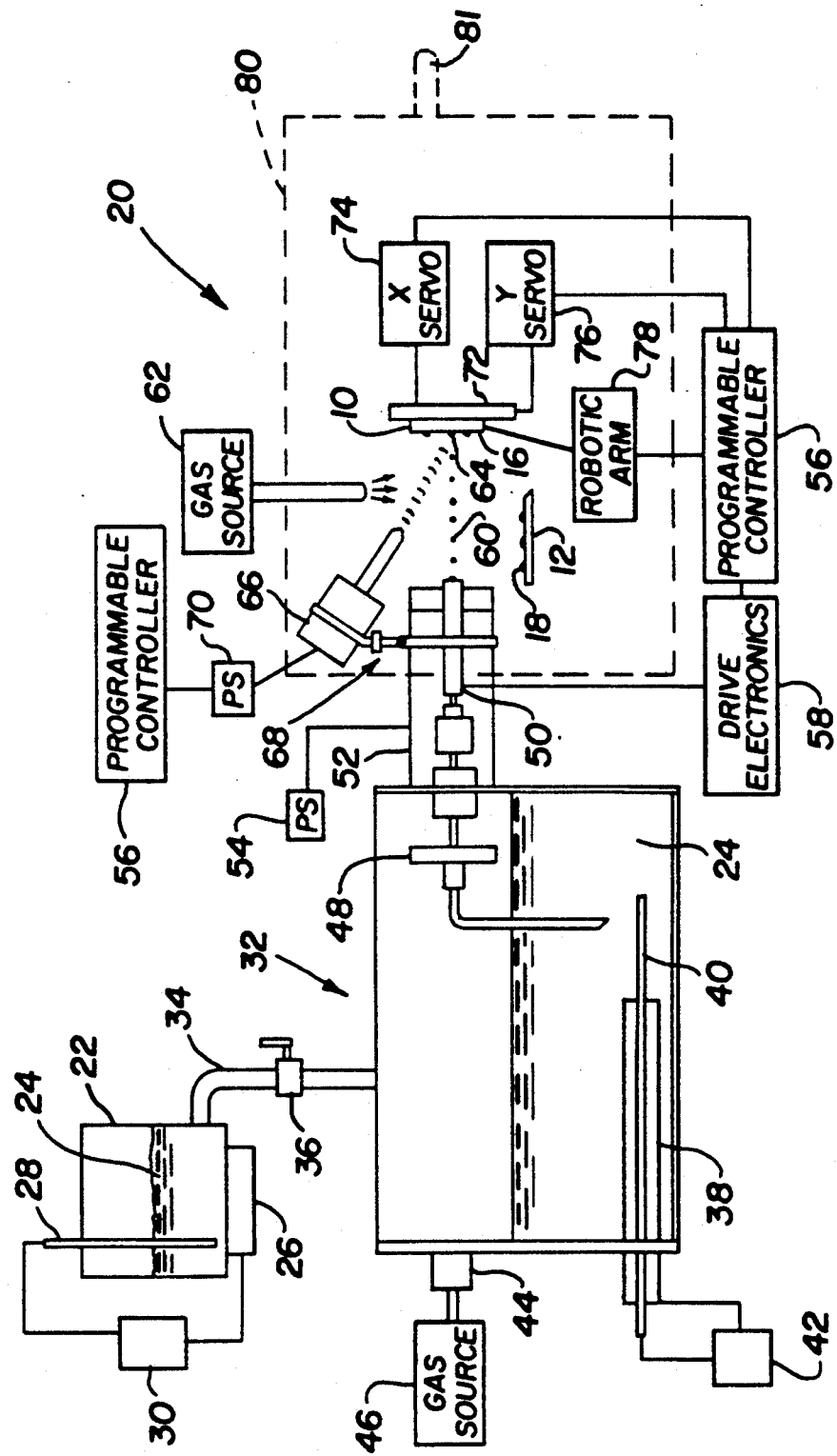
FIG. 3 is a simplified pictorial illustration of apparatus constructed in accordance with the invention for preparing and joining metallic surfaces without using flux or solvents.

Illustrated in FIG. 3 and generally designated by the reference character 20 is apparatus constructed in accordance with the present invention for performing soldering without using flux and/or solvents. As illustrated, the fluxless soldering apparatus 20 comprises a preload reservoir 22 for initially receiving and holding solder 24 in the liquid state. Heating element 26 is operatively positioned with respect to preload reservoir 22 to maintain the solder 24 liquid. Thermocouple 28 is operatively connected to control the power source 30 to heat the solder 24 and maintain it at the required temperature.

An ejection chamber 32 is connected to the outlet of preload reservoir 22 through conduit 34 and valve 36 which allows liquid solder 24 to flow from the preload reservoir 22 into ejection chamber 32. Oxides and impurities tend to stay at the top of the liquid solder 24 in the preload reservoir 22 and thus do not enter the ejection chamber 32. Heating element 38 is operatively positioned in ejection chamber 32 to maintain the solder 24 in the liquid state. Thermocouple 40 is connected to control power source 42 so the solder 24 will be maintained at the required temperature. The ejection chamber 32 is pressurized through inlet port 44 by an inert gas such as argon from gas source 46. The pressurized gas forces liquid solder 24 through filter 48 into the ejection device 50 to purge the system in preparation for operation. In the preferred embodiment ejection device 50 comprises either a drop-on-demand ejection device (see FIG. 3) or a charge-and-deflection ejection device (see FIG. 4) and is employed to produce generally spherically shaped drops 60 and direct them toward a target location. By appropriately positioning the target, the liquid drops 60 become solidified drops of solder adhering to the target in the form of solder bumps or balls 64 which remain generally spherical in shape. The target may be, for example, wettable metal pads 16 on a microelectronic device 10 such as a surface mount package, an integrated circuit chip, etc., or the wettable connect or bond pads 18 on a mounting substrate 12.

Although the ejection chamber 32 is not pressurized during operation, the space above the liquid solder 24 is filled with a relatively inert gas to eliminate oxygen from the atmosphere above the liquid solder 24. Heater 52, connected to power source 54, surrounds the ejection device 5 and controls the temperature of the liquid solder 24 within the ejection device 50. Programmable controller 56 provides activating signals to drive electronics 58 causing ejection device 50 to eject a drop or drops 60 of liquid solder 24 in a manner controlled by the particular program in programmable controller 56.

The space surrounding the drop or drops 60 of liquid solder 24 between ejection device 50 and the target is filled with a relatively inert gas to eliminate oxygen from the path traveled by the drops 60. A gas source 62 provides a flow of inert gas into the space traveled by the drops 60 and the area where the drops 60 land on the target. In the preferred embodiment, solder bumps or balls 64 are generally spherical in shape and can be provided in sizes which range in diameter from about twenty-five (25) μm to about two hundred (200) μm with the size of the solder bumps or balls 64 varying with the size of the nozzle of the ejection device 50 and the magnitude and frequency of pulses from drive electronics 58.

Fluxless soldering apparatus 20 also includes a laser device 66. In the preferred embodiment laser device 66 is a high-energy pulsed laser, i.e. excimer, which is capable of cleaning the exposed surfaces of a target (such as the wettable metal pads 16 or wettable connect or bond pads 18) by ablating away any surface oxides and/or contaminates. The energy from the laser device 66 cleans the exposed surfaces by ablation of those surfaces while the surfaces are maintained in an atmosphere of moving inert gas. Thus oxides will not be formed and contaminants will not be reformed or deposited on the cleaned surfaces. In the preferred embodiment, laser device 66 is moveably mounted by mounting means 68 so that the output of the laser device 66 and the output of the ejection device 50 may be aligned with their respective outputs converging on the target surface. Power supply 70 supplies the necessary power and activation signals to laser device 66. Power supply 70 is also controlled by programmable controller 56 so that the sequence of exciting or activating the laser device 66 and the ejection device 50 and the time periods between their separate excitation or activation are adjustable.

In one embodiment an X-Y table 72 is provided on which the target surface is mounted. The X-Y table 72 is equipped with an X-axis positioning servo 74 and a Y-axis positioning servo 76. Programmable controller 56 is operatively connected to the X-axis positioning servo 74 and the Y-axis positioning servo 76 and provides programmed control signals thereto to move the X-Y table 72 to a particular desired location and/or a predetermined sequence of locations with respect to ejection device 50 and laser device 66.

As illustrated in FIG. 3, a robotic arm 78 may be provided to control the position of the target surface. Programmable controller 56, operatively connected to robotic arm 78, provides programmed control signals to move the target to a particular desired location and/or a predetermined sequence of locations with respect to ejection device 50 and laser device 66.

The atmosphere in the ejection chamber 32, the path traveled by the drops 60 of liquid solder 24 and the space surrounding the target surface may be reducing or inert but must at least be reduced in oxygen to the point where the drops 60 of liquid solder 24 and the target will not be subject to oxidation. The inert atmosphere also greatly enhances formation of generally spherically drops of liquid solder which solidify into generally spherical balls. As previously noted, an inert gas may be blown by gas source 62 into the space surrounding the path traveled by the drops 60 of liquid solder 24 and the space surrounding the target surface.

It will be appreciated that a chamber or housing 80 enclosing the path traveled by the drops 60 of liquid solder 24 and the space surrounding the target surface will further insure that the target will not be subject to oxidation during deposition of solder balls thereon. The housing 80 may be used to provide a positive gas flow from gas source 62 to outlet 81. Thus oxides and/or contaminants removed from the target will flow out exhaust port 81 along with the inert gas and will not be redeposited on the cleaned surfaces.

Operation of the apparatus illustrated in FIG. 3 begins with placing solid solder in preload reservoir 22. In the preferred embodiment the solder comprises a eutectic of at least two of the elements of lead, tin, bismuth and indium. Power is applied to heating element 26 to bring the temperature of the particular solder to its melting point. After the solder is melted in the preload reservoir 22, a portion thereof is transferred through conduit 34 and valve 36 to the ejection chamber 32 where the solder 24 is maintained liquid by heating element 38. Ejection chamber 32 is pressurized with a relatively inert gas such as nitrogen or argon at a pressure of from about ten (10) to about thirty (30) psi. The pressurized gas forces liquid solder 24 through filter 48 and into ejection device 50. Ejection device 50 has a nozzle opening of about twenty-five (25) to about one hundred (100) microns in diameter and is excited with a signal from drive electronics 58 having a frequency between about two thousand (2000) to one hundred thousand (100,000) hertz.

Operation of the apparatus is discussed hereinafter with reference to wettable pads 16 on a microelectronic device 10 as the receiving target surface for the solder bumps or balls 64. It will be appreciated that substrate 12 or any other suitable target surface could be used.

The ejection device 50 and the laser device 66 are aligned with their respective outputs directed to converge on the wettable metal pad 16 on microelectronic device 10 when the microelectronic device 10 is located to an initial position. The system is then activated with programmable controller 56 providing control signals to the X-axis positioning servo 74 and the Y-axis positioning servo 76 so that the X-Y table moves through a predetermined sequence of locations with respect to the output location of the ejection device 50 and the laser device 66. At each location the X-Y table is stopped and the laser device 66 activated by the programmable controller 56 and power supply 70 to clean the surface of the portion of the wettable metal pad 16 positioned to receive the output from the laser device. The ejection device 50 is then activated by the programmable controller 56 and drive electronics 58 to eject a drop or drops 60 of liquid solder 24 onto the portion of the wettable metal pad 16 which was cleaned by the laser device 66. This sequence is repeated until all the wettable metal pads 16 have been cleaned and individual solder bumps or balls 64 formed thereon. Different layouts or locations of wettable metal pads 16 on the microelectronic device 10 only requires a program change to the programmable controller.

In the preferred embodiment the ejection device 50 comprises a piezoelectric transducer which ejects liquid solder in response to an excitation signal. Such ejection devices are easily adjusted to control the size of the solder bumps or balls 64. Small changes in diameter of the solder bump or ball 64 require only changes in excitation voltage. Large changes require changes in the size of orifice in the ejection device 50.

Figure 4:
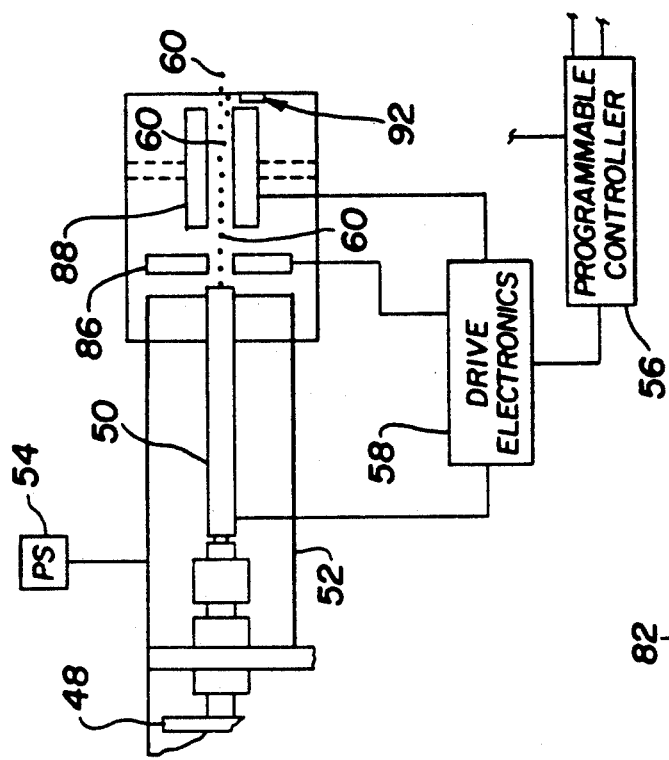
FIG. 4 is a simplified pictorial illustration of an additional embodiment of the ejection device of the invention.

A charge-and-deflection ejection device as illustrated in FIG. 4 may be used in place of the drop-on-demand ejection device illustrated in FIG. 3. In this embodiment the ejected drops 60 of liquid solder are charged to a predetermined polarity by applying a voltage of the proper polarity and magnitude to charge plates 86. The charged drops of liquid solder travel through an electric field created by application of a high voltage to a pair of deflection plates 88. Depending on the charge applied to the drops 60 of liquid solder, the drops 60 will be deflected to the desired target or will be deflected to catcher 92.

Figure 5:
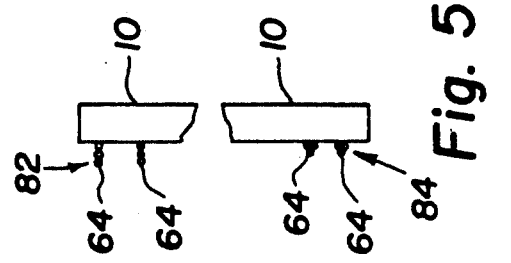
FIG. 5 is a simplified pictorial illustration of drops of solder stacked o an integrated circuit chip in accordance with the invention.

As illustrated in FIG. 5 the drops 60 of liquid solder 24 may be deposited one drop on top of another drop, etc., to form a stack 82 or may be deposited in a pyramid 84, depending on the size and shape of the wettable target. Higher stacks of solder bumps or balls 64 tend to provide better reliability during temperature cycling because of less shear stress in the solder joint.

Figure 6:
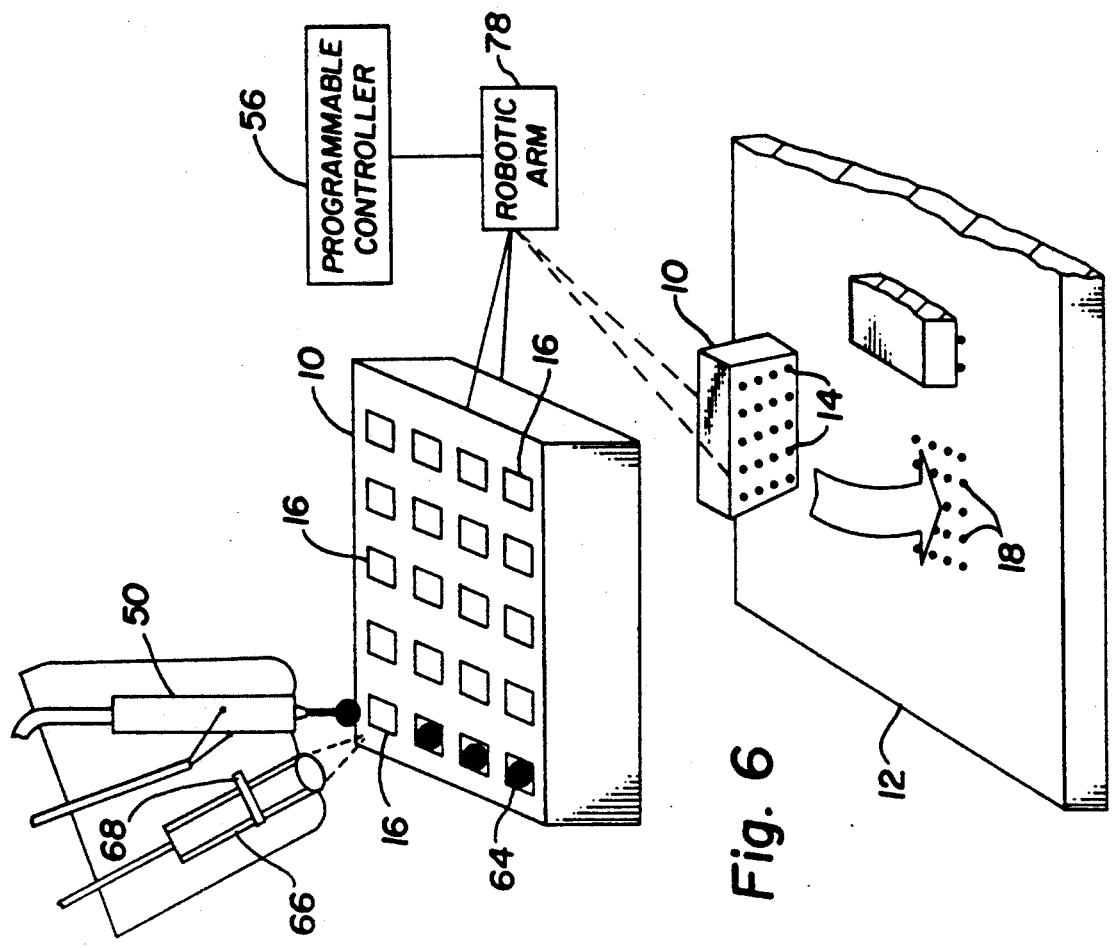
FIG. 6 is an enlarged pictorial illustration of a portion of apparatus constructed in accordance with the invention for preparing and joining metallic surfaces without using flux or solvents.

A more clear view of the cleaning and soldering operation is shown in FIG. 6. As illustrated therein, three wettable metal pads 16 have been cleaned by the output energy of laser device 66 and drops of solder deposited thereon by ejection device 50 forming solidified solder bumps or balls 64. After all or a predetermined number of the wettable metal pads 16 have been cleaned and received solder bumps or balls 64, robotic arm 78 places microelectronic device 10 on substrate 12 so that the solder bumps or balls 64 contact the wettable connect or bond pads 18. When properly heated, the solder bumps or balls 64 melt and reflow to join the wettable metal pads 16 to wettable connect or bond pads 18.

It will be appreciated that identical results will be achieved if the solder bumps or balls 64 are deposited on wettable connect or bond pads 18 or substrate rather than the wettable metal pads 16 on microelectronic device 10. However, in order to assure reflow soldering of the bumps 14 to the pads 18 on the substrate (or vice versa), the pads 18 should also be cleaned with the laser 66 and maintained within the inert atmosphere until the solder deposition and reflow soldering process is completed.

From the foregoing it will be appreciated that soldering apparatus constructed and operated in accordance with this invention may be used to join metallic surfaces with solder without using flux or solvents. Although the invention has been described with particular reference to presently preferred embodiments thereof it will be appreciated by those skilled in the art that various modifications, alterations, variations, etc., may be made without departing from the spirit and scope of the invention as defined in the appended claims.

What is claimed:

1. The method of joining metallic surfaces comprising the steps of:
   (a) positioning and maintaining a first metallic surface and a second metallic surface in a relatively inert environment;
   (b) cleaning said first and said second surfaces with laser energy;
   (c) forming a deposit of solder on one of said first and second surfaces;
   (d) moving said first and second surfaces with respect to each other to position said deposit of solder in contact with the other of said first and second surfaces; and
   (e) heating said deposit of solder until it reflows and forms a solder bond between said first metallic surface and said second metallic surface.

2. The method of preparing first and second surfaces to be joined with solder comprising the steps of:
   (a) maintaining a first surface and a second surface in an atmosphere of relatively inert gas;
   (b) providing a laser device producing laser energy in a predetermined band of wavelengths for cleaning said first surface and said second surface;
   (c) providing an ejection device for ejecting drops of liquid solder;
   (d) aligning said laser device to deliver laser energy to one of said first surface and said second surface;
   (e) aligning said ejection device to deliver drops of liquid solder to said one of said first surface and said second surface;
   (f) activating said laser device at a predetermined time, causing laser energy to be emitted and delivered to said one of said first surface and said second surface, to clean said one of said first surface and said second surface; and
   (g) activating said ejection device at a different predetermined time, causing a predetermined number of drops of liquid solder to be emitted and delivered through said atmosphere of relatively inert gas to said one of said first surface and said second surface where said predetermined number of drops form a solid solder deposit.

3. The method of claim 2 further including the steps of:
   (a) aligning said laser device so that the laser energy therefrom will be delivered to the other one of said first surface and said second surface; and
   (b) activating said laser device, causing laser energy to be emitted and delivered to said other one of said first surface and said second surface, to clean said other one of said first surface and said second surface.

4. The method of claim 2 wherein said different predetermined time of activating said ejection device occurs after said predetermined time of activating said laser device.

5. The method of claim 2 wherein said predetermined number of drops of liquid solder comprises one drop.

6. The method of claim 2 wherein said predetermined number of drops of liquid solder comprises more than one drop.

7. The method of claim 2 wherein said first surface comprises multiple wettable metal pads on a microelectronic device.

8. The method of claim 7 wherein said microelectronic device comprises a surface mount package.

9. The method of claim 7 wherein said microelectronic device comprises an integrated circuit chip.

10. The method of claim 3 further including the steps of:
    (a) causing relative movement between said first surface and said second surface to place said deposit located on said one of said first surface and said second surface in contact with said other one of said first surface and said second surface; and
    (b) heating said first surface, said second surface and said solder deposit to reflow the solder and join said first and second surfaces.

11. Apparatus for preparing a first surface and a second surface to be joined with solder comprising:

(a) means for maintaining a first surface and a second surface in an atmosphere of relatively inert gas;
(b) a laser device adapted to clean said first surface and said second surface; and
(c) an ejection device adapted to receive liquid solder and eject a predetermined number of drops of liquid solder onto one of either said first surface or said second surface after such surface has been cleaned by said laser device.

12. Apparatus as defined in claim 11 further including:
(a) means for moving one of said first surface and said second surface with respect to the other surface and place the solder located on said one of either said first surface or said second surface in contact with said other one of said first surface and said second surface; and means for heating said first surface, said second surface and said solder to reflow the solder and join said first and second surfaces.

13. Apparatus as defined in claim 11 wherein said laser device is a pulsed laser.

14. Apparatus as defined in claim 11 wherein said laser device is a continuous wave laser.

15. Apparatus as defined in claim 11 wherein said predetermined number of drops of liquid solder is one drop.

16. Apparatus as defined in claim 11 wherein said predetermined number of drops of liquid solder is more than one drop.

17. Apparatus as defined in claim 11 wherein said first surface comprises multiple wettable metal pads on a microelectronic device.

18. Apparatus as defined in claim 17 wherein said microelectronic device is a surface mount package.

19. Apparatus of as defined in claim 17 wherein said microelectronic device is an integrated circuit chip.

20. Apparatus as defined in claim 11 wherein said second surface comprises multiple wettable connect pads on a substrate.

* * * * *

UNITED STATES PATENT AND TRADEMARK OFFICE
CERTIFICATE OF CORRECTION

PATENT NO. : 5,193,738
DATED : March 16, 1993
INVENTOR(S) : Donald J. Hayes

It is certified that error appears in the above-identified patent and that said Letters Patent is hereby corrected as shown below:

```
Column 1, line 41,    cancel "over"
Column 1, line 56,    after "surfaces" insert ---and---
Column 1, line 68,    cancel "and"
Column 2, line 14,    change "o" to ---on---
Column 2, line 65,    change "5" to ---50---
Column 4, line 27,    change "microns" to ---µm---
Column 7, line 15,    change "and" to ---to---
Column 7, line 19,    before "means" insert ---(b)---
```

Signed and Sealed this

Thirtieth Day of November, 1993

Attest:

BRUCE LEHMAN

Attesting Officer

Commissioner of Patents and Trademarks